United States Patent [19]
Koshimizu

[11] Patent Number: 5,935,373
[45] Date of Patent: Aug. 10, 1999

[54] PLASMA PROCESSING APPARATUS

[75] Inventor: Chishio Koshimizu, Yamanashi-ken, Japan

[73] Assignee: Tokyo Electron Limited, Tokyo, Japan

[21] Appl. No.: 08/921,715

[22] Filed: Sep. 2, 1997

[30] Foreign Application Priority Data

Sep. 27, 1996 [JP] Japan .................................. 8-277370

[51] Int. Cl.$^6$ .................................................. H05H 1/00
[52] U.S. Cl. ................ 156/345; 118/723 I; 204/298.08; 204/298.34
[58] Field of Search .......................... 156/345; 118/723 I, 118/723 R; 204/298.34, 298.31, 298.02, 298.08, 298.06

[56] References Cited

U.S. PATENT DOCUMENTS

| | | | |
|---|---|---|---|
| 5,614,060 | 3/1997 | Hanawa | 156/345 |
| 5,683,538 | 11/1997 | O'Neill et al. | 156/345 |
| 5,685,942 | 11/1997 | Ishii | 156/345 |
| 5,824,606 | 10/1998 | Dible et al. | 156/345 |

FOREIGN PATENT DOCUMENTS

| | | |
|---|---|---|
| 1-149965 | 6/1989 | Japan . |
| 6-280029 | 10/1994 | Japan . |
| 6-314660 | 11/1994 | Japan . |
| 7-122399 | 5/1995 | Japan . |
| 7-142453 | 6/1995 | Japan . |

Primary Examiner—Thi Dang
Attorney, Agent, or Firm—Oblon, Spivak, McClelland, Maier & Neustadt, P.C.

[57] ABSTRACT

This invention relates to an antenna division RF induction plasma generation apparatus, and has as its object to prevent hunting between RF antennas, and to improve control of the etching selectivity and the etching shape. In an antenna division RF induction plasma apparatus, an RF antenna is arranged on an insulator of a processing chamber. The antenna is constituted by a first RF antenna, and a second RF antenna arranged at a predetermined interval therefrom. A substrate is placed on a lower electrode arranged in the processing chamber. RF powers having phases controlled are applied to the first and second RF antennas and/or the lower electrode. As the RF power, the RF power of continuous waves or an RF power pulse train can be employed.

19 Claims, 3 Drawing Sheets

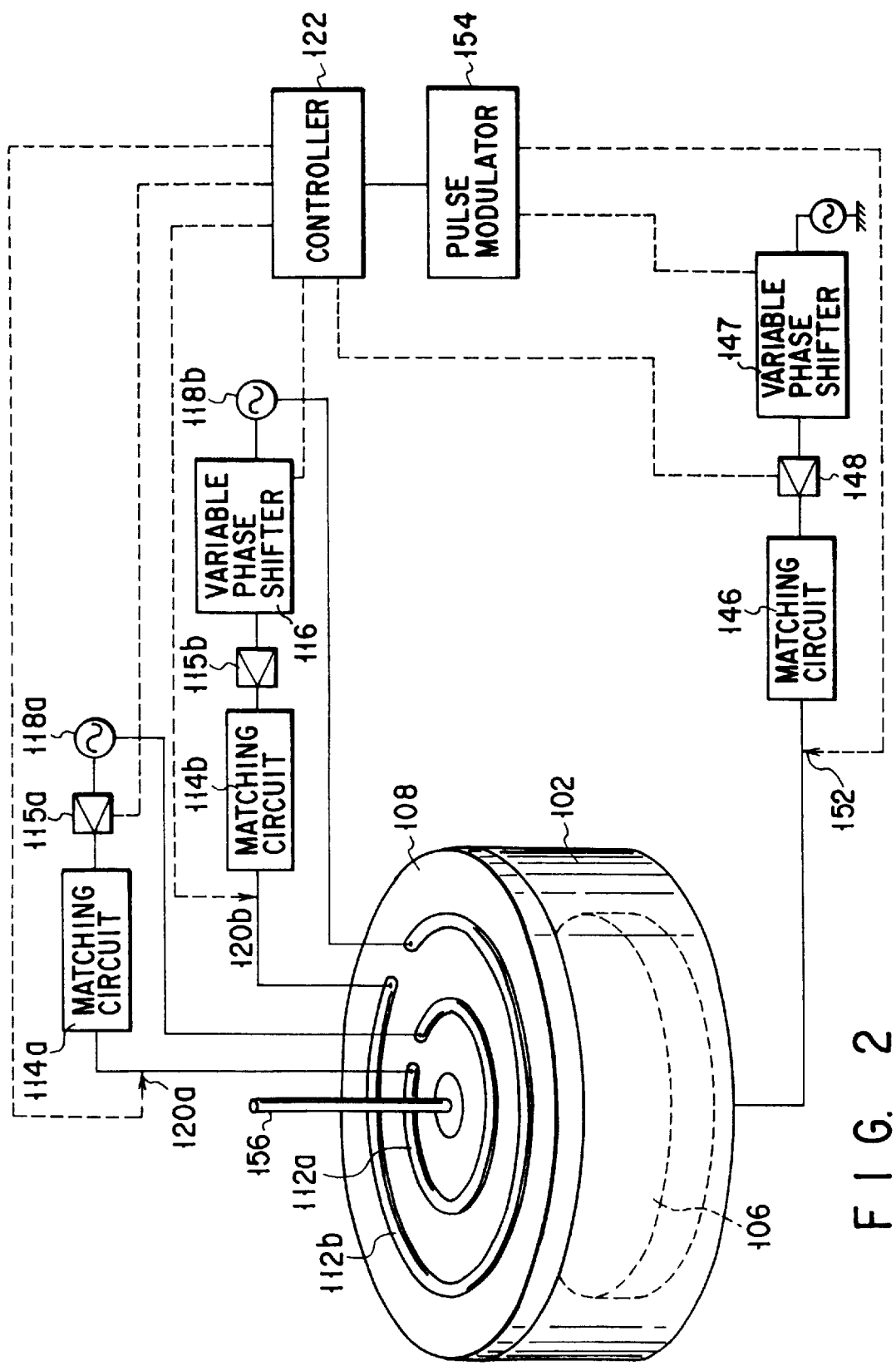
F I G. 2

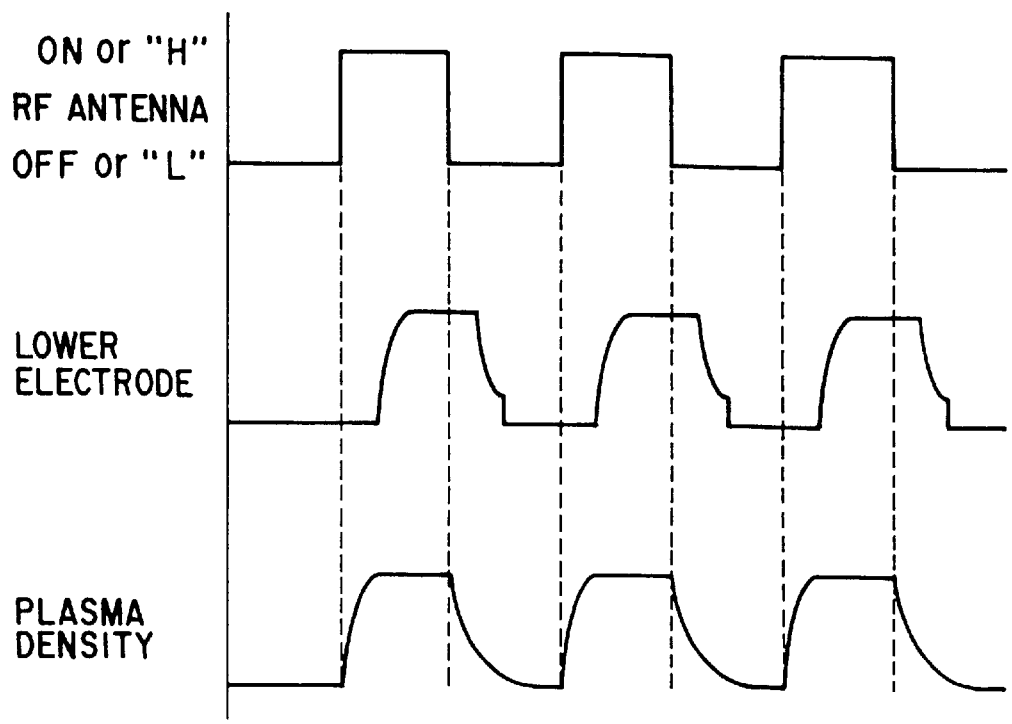
F I G. 3A
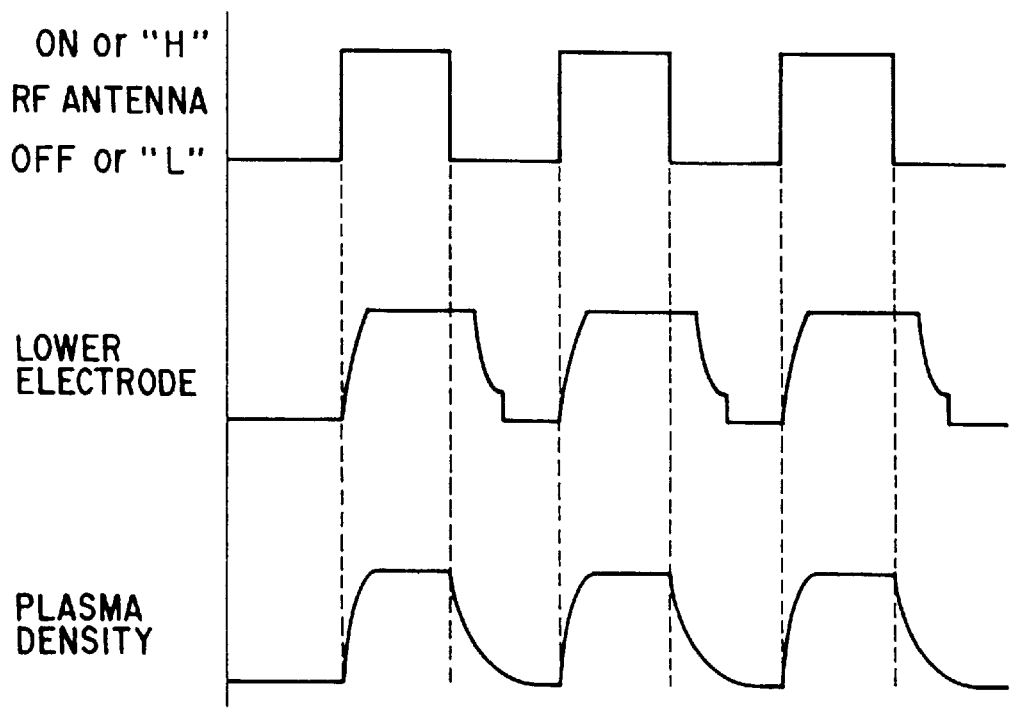
F I G. 3B

PLASMA PROCESSING APPARATUS

BACKGROUND OF THE INVENTION

The present invention relates to various plasma processing apparatuses such as a plasma etching apparatus, an ashing apparatus, a film formation apparatus, and a sputtering apparatus and, more particularly, to a plasma processing apparatus excellent in terms of an improvement in uniformity of a plasma generated in the plasma processing apparatus, an increase in plasma generation efficiency, an increase in processing precision, a reduction in damage to a substrate, and the like.

Known plasma processing apparatuses are apparatuses for performing various processes such as ashing, etching, CVD processing, and sputtering in an apparatus of manufacturing a semiconductor integrated circuit. In these apparatuses, an RF induction plasma generation apparatus using a coiled antenna has been known as an apparatus for generating a plasma.

An example of this RF induction plasma generation apparatus is disclosed in European at. Appln. KOKAI No. 379828. The RF induction plasma generation apparatus disclosed in European at. Appln. KOKAI No. 379828 has a wall opposing a wafer susceptor consisting of an insulator such as silica glass, and a coiled antenna fixed on the outer surface of the insulator wall. A processing gas is ionized by an RF electromagnetic field formed by flowing an RF current through this antenna, thereby generating a plasma.

An antenna division RF induction plasma generation apparatus is also disclosed in European Pat. Appln. KOKAI No. 379828. In this antenna division RF induction plasma generation apparatus, the antenna is constituted by two set of coiled antennas in order to precisely control, over a wide range, a generation region where a plasma is generated. An RF power is applied to each antenna.

This RF induction plasma generation apparatus is used as an apparatus for a charge elimination process of eliminating the charge of a jack, a cleaning process of cleaning the wall of a chamber, an etching process, and the like.

The plasma processing apparatus of the antenna division RF induction type has a technical problem that the plasma is difficult to uniformly generate, and another technical problem that hunting occurs between the divided antennas. In addition, the etching selectivity and the etching shape must be controlled.

BRIEF SUMMARY OF THE INVENTION

It is an object of the present invention to solve or reduce the above problems of the conventional antenna division RF induction plasma processing apparatus.

It is another object of the present invention to improve the uniformity of a plasma to be generated.

It is still another object of the present invention to prevent occurrence of hunting between two antennas.

It is still another object of the present invention to increase the plasma generation efficiency.

It is still another object of the present invention to enable control of the etching selectivity and control of the etching shape when plasma etching is performed by the plasma processing apparatus.

It is still another object of the present invention to control the plasma generation region, clean an arbitrary region, and shorten the cleaning time when the chamber of the plasma processing apparatus is cleaned with the plasma.

The present invention relates to a plasma processing apparatus comprising a plasma processing chamber, a first RF antenna arranged at an outer peripheral portion of the plasma processing chamber, a second RF antenna arranged at the outer peripheral portion of the plasma processing chamber at a predetermined interval from the first RF antenna, a plasma generation RF power supply unit for supplying plasma generation RF powers to the first and second RF antennas, a lower electrode (i.e. susceptor) in the processing chamber to place a substrate thereon, and a bias RF power supply unit for supplying a bias RF power to the lower electrode. In this plasma processing apparatus, the present invention solves the above problems by employing one or a combination of two or more of various features and improvements to be described below.

The first feature and improvement of the present invention are that the plasma generation RF power supply unit has phase control means for controlling the phases of the RF powers to be supplied to the first and second RF antennas.

Another feature and improvement of the present invention associated with the first feature and improvement are that the phase control means controls the plasma generation RF powers in phase, that the plasma generation RF power supply unit is a unit for forming the RF power of continuous waves as the plasma generation RF power, and that the plasma generation RF power supply unit forms an RF power pulse train as the plasma generation RF power.

The second feature and improvement of the present invention are that the bias RF power supply unit has phase control means for controlling the phase of the RF power to be supplied to the lower electrode.

Another feature and improvement of the present invention associated with the second feature and improvement are that the bias RF power supply unit supplies an RF power having the same frequency as that of the plasma generation RF power to the lower electrode, that the phase control means of the bias RF power supply unit controls the phase to reduce hunting between the plasma generation RF power and the bias RF power, that the bias RF power supply unit forms an RF power pulse train as the bias RF power to be supplied to the lower electrode, and that the bias RF power supply unit is a unit for forming the RF power pulse train as the bias RF power, and controls the ON/OFF duty ratio of the RF power pulse train.

The third feature and improvement of the present invention are that the plasma generation RF power supply unit has phase control means for controlling the phases of the respective RF powers to be supplied to the first and second RF antennas, and that the bias RF power supply unit has phase control means for controlling the phase of the RF power to be supplied to the lower electrode.

Another feature and improvement of the present invention associated with the third feature and improvement are that these phase control means control the plasma generation RF power and the bias RF power in phase, that the bias RF power supply unit forms an RF power pulse train as the bias RF power to be supplied to the lower electrode, that the phase control means of the bias RF power supply unit controls the bias RF power pulse train to have a predetermined delay from the RF power of the plasma generation RF power pulse train, that the phase control means of the bias RF power supply unit controls the bias RF power pulse train to have a predetermined delay from the RF power of the plasma generation RF power pulse train, and that the bias RF power supply unit forms an RF power pulse having a pulse width of the bias RF power pulse train larger than that of the plasma generation RF power pulse train, and a waveform in which a power value is decreased in an after glow period of a plasma.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic view of the plasma processing apparatus when the present invention is applied to plasma processing; and FIGS. 3A and 3B are timing charts, respectively, for controlling the plasma processing apparatus with a pulse when the present invention is applied to plasma processing.

DETAILED DESCRIPTION OF THE INVENTION

Figure 1:
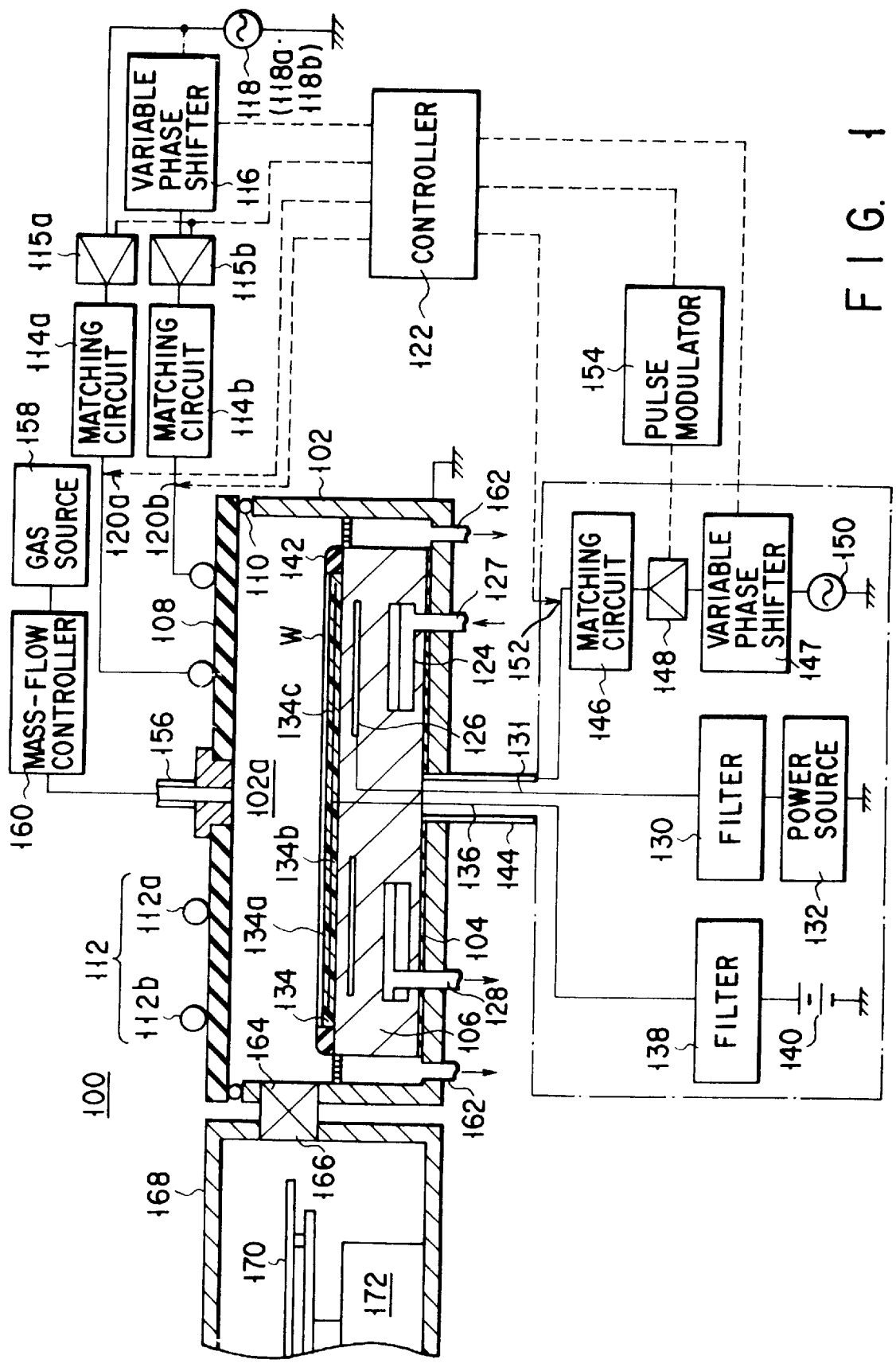
FIG. 1 is a sectional view showing the schematic arrangement of a plasma processing apparatus when the present invention is applied to plasma processing.

A plasma processing apparatus of the present invention can be applied to various plasma processes.

An embodiment in which the plasma processing apparatus of the present invention is applied to an antenna division RF induction plasma etching apparatus (TCP) 100 will be described with reference to FIG. 1.

A processing vessel 102 of the plasma etching apparatus 100 is made of a conductive material, e.g., aluminum, and is formed into a cylindrical shape or a rectangular cylindrical shape. The processing vessel 102 incorporates a processing chamber 102a wherein plasma etching is performed.

The processing vessel 102 is grounded, and has an almost susceptor 106 at its bottom portion. A substrate, e.g., a semiconductor wafer W is placed on the susceptor 106 via an insulating plate 104 such as a ceramic plate. An insulator 108 is airtightly arranged via a seal member 110 such as an O-ring at the top plate portion, of the processing vessel 102, opposing the susceptor 106. The insulator 108 is made of, e.g., silica glass or a ceramic. An RF antenna 112 (112a, 112b) formed into a loop shape is arranged on the outer wall surface of the insulator 108. The RF antenna 112 is made of a conductor such as a copper plate, aluminum, or stainless steel. The antenna 112 (112a, 112b) has only a function of generating a plasma by the antenna action. The antenna shape is not limited to the loop shape, and various shapes can be employed.

Referring to FIG. 2, the RF antenna 112 is constituted by a first RF antenna 112a arranged near the center on the outer wall surface of the insulator 108, and a second RF antenna 112b arranged around the first RF antenna 112a at a predetermined interval. The layout of the RF antenna 112 is not limited to a concentric layout like the one shown in FIG. 2, and various layouts can be employed. For example, one antenna of the RF antenna 112 may be arranged on the outer wall surface of the insulator 108, whereas the other may be arranged on the outer side surface of the processing vessel 102.

Referring back to FIG. 1, each of the RF antennas 112a and 112b is connected to an RF power supply unit constituted by a matching circuit 114 (114a, 114b), an amplifier 115 (115a, 115b), a variable phase shifter 116, and an RF power supply 118 (118a, 118b). The phases of RF powers to be applied to the respective RF antennas 112a and 112b can be controlled by the variable phase shifter 116.

The plasma etching apparatus 100 has phase detection circuits 120a and 120b on the output side of the matching circuit 114 (114a, 114b).

To uniformly generate a plasma by optimizing the plasma density/distribution in the plasma etching apparatus 100, the phases of the RF powers to be applied to the respective RF antennas 112a and 112b must be controlled to prevent mutual interference of electromagnetic fields formed by the first and second RF antennas 112a and 112b. However, even if the variable phase shifter 116 adjusts the phases of the RF powers, the phases of the RF powers to be applied to the respective RF antennas 112a and 112b slightly shift to fail to obtain desired phases because of the difference between the lengths of wires respectively connecting the RF power supplies 118a and 118b to the RF antennas 112a and 112b, and the influence of an electrical circuit arranged midway along the wire.

In the plasma etching apparatus 100, the phases of the RF powers are detected by the phase detection circuits 120a and 120b arranged on the output side of the matching circuit 114 (114a, 114b), and the variable phase shifter 116 is controlled by a controller 122 on the basis of the detected values, thereby setting the phases of the RF powers to predetermined values.

Referring back to FIG. 1, the susceptor 106 can be constituted by assembling a plurality of members formed of aluminum or the like with bolts or the like. The susceptor 106 incorporates temperature adjustment means such as a cooling means 124 and a heating means 126 to adjust the processing surface of the semiconductor wafer W at a desired temperature.

The cooling means 124 is constituted by, e.g., a cooling jacket. A coolant, e.g., liquid nitrogen is introduced into this cooling jacket through a coolant inlet pipe 127. The introduced liquid nitrogen circulates in the cooling means 124 to generate cooling heat upon nucleus boiling. With this arrangement, e.g., $-196°$ C.-cooling heat of the liquid nitrogen conducts from the cooling means 124 to the semiconductor wafer W via the susceptor 106 to cool a processing surface F of the semiconductor wafer W to a desired temperature. Nitrogen gas generated upon nucleus boiling of the liquid nitrogen is exhausted outside the vessel through a coolant outlet pipe 128.

The susceptor 106 has the heating means 126. The heating means 126 is constituted by inserting a conductive resistance heating member made of, e.g., tungsten in an insulating sintered member made of, e.g., aluminum nitride. The resistance heating member receives a power from a power source 132 via a filter 130 and a power supply lead 131, and generates heat to heat the processing surface of the semiconductor wafer W to a desired temperature.

An electrostatic chuck portion 134 for holding the substrate is arranged at the center of the upper surface of the susceptor 106. The diameter of the chuck portion is almost equal to, and preferably, slightly smaller than that of the semiconductor wafer W. The electrostatic chuck portion 134 is constituted by interposing a conductive film 134c such as a copper foil between two films 134a and 134b consisting of a polymeric insulating material such as a polyimide resin. A voltage supply lead 136 connects the conductive film 134c to a variable DC voltage source 140 via a filter 138 for cutting an RF frequency. A high voltage of, e.g., 2 kV is applied to the conductive film 134c to chuck the semiconductor wafer W on the upper surface of the upper film 134a by the Coulomb force.

An annular focus ring 142 is arranged around the susceptor 106 to surround the semiconductor wafer W. The focus ring 142 is made of an insulating or conductive material which does not attract reactive ions in the plasma. By the focus ring 142, the reactive ions in the plasma can be effectively injected into the semiconductor wafer W inside the focus ring 142.

The susceptor 106 is connected to a hollow conductive feeding bar 144. The feeding bar 144 is connected to a bias RF power supply unit constituted by a matching circuit 146, an amplifier 148, and an RF power supply 150.

In plasma processing, a predetermined frequency, e.g., an RF power of 2 MHz is applied to the susceptor 106. A bias potential is generated between the susceptor 106 and the plasma in the processing chamber 102a to effectively attract the reactive ions in the plasma to the processing surface of the substrate.

A phase detector 152 is set on the output side of the matching circuit 146. The phase detector 152 detects the phase of the current of the RF power to be applied to the susceptor 106. On the basis of this detection value, the controller 122 controls a variable phase shifter 147 to control the phase of the current of the bias RF power.

A pulse modulator 154 having functions of setting the duty ratio and delaying the phase is connected to the amplifier 148. In plasma processing, a bias RF power pulse-modulated within the range of, e.g., 1 Hz to 1 MHz is applied to the susceptor 106 in accordance with the plasma generation RF power (continuous RF power or RF power pulse train) to be applied to the first and second RF antennas 112a and 112b.

A processing gas supply port 156 is formed in the central portion of the insulator 108 above the susceptor 106. A processing gas such as $C_4F_8$ gas or Ar gas is introduced from a gas source 158 into the processing chamber 102a via a mass-flow controller 160.

An exhaust pipe 162 is connected to the bottom portion of the processing vessel 102 to exhaust the gas in the processing vessel 102 by an evacuating means (not shown) such as a vacuum pump. The atmosphere in the processing chamber 102a is evacuated to a low-pressure atmosphere of, e.g., 20 mTorr or less.

A substrate load/unload port 164 is formed in the side portion of the processing vessel 102. The load/unload port 164 communicates with a load-lock chamber 168 via a gate valve 166. The gate valve 166 is automatically opened/closed by a driving mechanism (not shown). A transport mechanism 172 is set in the load-lock chamber 168. Semiconductor wafers W are loaded by the transport mechanism 172 into the processing vessel 102 one by one.

When plasma processing is performed in the plasma processing apparatus 100, RF powers are applied to the first and second RF antennas 112a and 112b to form RF electromagnetic fields in the processing chamber 102a. Due to the electromagnetic fields, electrons in the processing gas collide with neutral particles to ionize the processing gas, thereby generating a plasma.

When a bias RF power is applied to the susceptor 106, a bias potential is generated between the plasma and the susceptor 106 to effectively draw reactive ions in the plasma into the substrate.

Process control in various modes in the plasma processing apparatus 100 will be explained below.

(1) When the RF power of continuous waves is applied to the RF antenna 112, each of the phase detectors 120a and 120b detects the phase of the current of the RF power. The controller 122 controls the variable phase shifter on the basis of the detected phase. As a result, the phase of the current is controlled to optimally generate an RF electromagnetic field in the processing chamber 102a.

A phase shift between the RF antennas 112a and 112b can be controlled by the controller 122 to avoid or reduce the interference phenomenon between the first and second RF antennas 112a and 112b.

When a bias frequency power having the same frequency as that for the plasma generation RF antennas 112a and 112b is applied to the lower electrode 106, the first and second RF antennas 112a and 112b are balanced with the bias to avoid or reduce the interference.

When an RF power pulse train is applied to the lower electrode, if the ON/OFF duty ratio and application power of the pulse are optimally controlled, the deposition time of etching radical species to the wafer W during the OFF period, and the ion impact time of the etching radical species to the wafer W during the ON period can be discriminately controlled. As a result, control of the etching shape and control of the selectively are improved. Since the potential of the plasma during the OFF period becomes lower than that during the ON period, charge-up can also be controlled.

Depending on an etching target, the etching gas, the doping gas, or the bias frequency must be changed to change the priority of process factors such as the etching shape, rate, and selectivity.

In these cases, the pulse modulator 154 performs pulse modulation control to apply, to the lower electrode 106, an RF power pulse train having a frequency different from that for the first and second RF antennas 112a and 112b. By optimizing the duty ratio and application power of the RF power pulse train, control of the etching shape for the substrate, and control of the selectivity can be improved, as described above.

(2) Case Wherein RF Power Pulse Train is Applied to RF Antenna

The density of negative ions in the plasma, and the etching time can be controlled by applying a plasma generation RF power pulse train to the first and second RF antennas 112a and 112b.

In this case, an RF power pulse train formed by pulse modulation control is applied to the lower electrode 106. The dissociated state of the gas in the plasma changes depending on the ON and OFF periods of the plasma generation RF power pulse train. To realize a desired etching selectivity and etching shape, the bias RF power pulse train is controlled to draw etchants in accordance with a period when many preferable etchants exist. For example, to draw a moderate after glow plasma into the target processing surface, a method of delaying the RF power pulse train to be applied to the lower electrode 106, or a method of widening the pulse width of the RF power pulse train can be employed, as shown in FIGS. 3A and 3B.

In the after glow period, the plasma density rapidly decreases. When a bias power having the same power as that in the main plasma generation period is applied to the lower electrode, a sheath voltage for drawing the after glow plasma abruptly rises to damage the substrate. To avoid or reduce this phenomenon, a method of reducing the bias power to a predetermined value on the basis of a preset sequence in the after glow period, or a method of changing the bias power in accordance with changes in plasma density during the after glow period can be employed.

As described above, the deposition time to the wafer W and the ion impact time to the wafer W can be discriminately controlled by optimally controlling the ON/OFF duty ratio and application power of the RF power pulse train to be applied to the lower electrode. As a result, control of the etching shape and control of the selectivity are improved. Since the potential of the plasma in the OFF period becomes lower than that in the ON period, charge-up can be reduced by controlling the ON/OFF duty ratio of the RF power pulse.

The plasma processing apparatus according to the present invention has been described using the antenna division RF induction plasma generation apparatus as an embodiment. The present invention is not limited to this embodiment. Various changes and modifications will be apparent within the technical spirit and scope described in the following claims, and also belong to the technical scope of the present invention.

For example, in the etching apparatus of this embodiment, two one-turn-loop-shaped RF antennas are arranged. The present invention is not limited to this antenna, and antennas with any structure capable of controlling the respective phases can be employed as the first and second RF antennas.

In the etching apparatus of this embodiment, the processing gas is supplied from the upper portion of the processing vessel 102. The present invention can employ an arrangement wherein the processing gas is supplied from the side portion of the processing vessel 102.

In the embodiment shown in FIGS. 1 and 2, both the phase control means and the pulse control means are arranged. The present invention is not limited to this embodiment, and can employ an arrangement wherein either one of the phase control means and the pulse control means is arranged in accordance with a process.

In the above embodiment, the present invention is applied to the etching apparatus. However, the present invention is not limited to the etching apparatus, and is applicable to various plasma processing apparatuses including an ashing apparatus, a film formation apparatus, and a sputtering apparatus.

The plasma processing apparatus according to the present invention can process not only a semiconductor wafer but also various substrates requiring plasma processing, such as a glass substrate for a liquid crystal display apparatus.

As has been described above, according to the present invention, the uniformity of the plasma generated in the processing chamber can be improved, hunting between the divided antennas can be prevented, and the plasma generation efficiency can be increased by controlling the phases of RF powers to be applied to the RF antenna and the lower electrode, and/or by performing pulse modulation control. Further, in performing etching, the etching selectivity and the etching shape can be easily and accurately controlled.

Other advantages and changes of the present invention will be apparent to those skilled in the art. The spirit and scope of the present invention are not limited to the detailed description, the illustrated embodiment and its description in this specification, and is interpreted within the widest scope of the inventive concept defined in the following claims.

Therefore, the present invention can be variously changed without departing from the scope of the inventive concept defined in the following claims, and the scope of a concept equivalent thereto.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A plasma processing apparatus comprising:

a plasma processing chamber;

a first RF antenna arranged at an outer peripheral portion of said plasma processing chamber;

a second RF antenna arranged at the outer peripheral portion of said plasma processing chamber at a predetermined interval from said first RF antenna;

a phase detection circuit for detecting phases of RF powers respectively supplied to said first RF antenna and said second RF antenna;

a plasma generation RF power supply unit for supplying plasma generation RF powers to said first and second RF antennas, said plasma generation RF power supply unit having phase control means for controlling phases of the RF powers to be supplied to said first and second RF antennas;

a lower electrode in said processing chamber to place a substrate thereon; and a bias RF power supply unit for supplying a bias RF power to said lower electrode, and having a phase control mechanism configured to control a phase of the bias RF power so as to delay the phase of the bias RF power with respect to the phases of the RF powers respectively supplied to said first RF antenna and said second RF antenna.

2. An apparatus according to claim 1, wherein said phase control means in said plasma generation RF power supply unit controls the plasma generation RF powers to be supplied to said first and second RF antennas to be in phase.

3. An apparatus according to claim 1, wherein said plasma generation RF power supply unit forms an RF power of continuous waves as the plasma generation RF powers to be supplied to said first and second RF antennas.

4. An apparatus according to claim 1, wherein said plasma generation RF power supply unit forms RF power pulse trains as the plasma generation RF powers to be supplied to said first and second RF antennas, and said phase control means controls phases of respective RF power pulse trains to be supplied to said first and second RF antennas.

5. A plasma processing apparatus comprising:

a plasma processing chamber;

a first RF antenna arranged at an outer peripheral portion of said plasma processing chamber;

a second RF antenna arranged at the outer peripheral portion of said plasma processing chamber at a predetermined interval from said first RF antenna;

a phase detection circuit for detecting phases of RF powers respectively supplied to said first RF antenna and said second RF antenna;

a plasma generation RF power supply unit for supplying plasma generation RF powers to said first and second RF antennas;

a lower electrode in said processing chamber to place a substrate thereon; and a bias RF power supply unit for supplying a bias RF power to said lower electrode, said bias RF power supply unit having phase control means for controlling a phase of the bias RF power to be supplied to said lower electrode so as to delay the phase of the bias RF power with respect to the phases of the RF powers respectively supplied to said first RF antenna and said second RF antenna.

6. An apparatus according to claim 5, wherein said bias RF power supply unit supplies, to said lower electrode, an RF power having a same frequency as those of the plasma generation RF powers to be supplied to said first and second RF antennas.

7. An apparatus according to claim 5, wherein said phase control means in said bias RF power supply unit controls the phase of the bias RF power to reduce hunting between the plasma generation RF powers to be supplied to said first and second RF antennas and the bias RF power.

8. An apparatus according to claim 5, wherein said bias RF power supply unit forms and supplies an RF power pulse train as the bias RF power to be supplied to said lower electrode, and said phase control means controls a phase of the RF power pulse train to be supplied to said lower electrode.

9. An apparatus according to claim 8, further comprising:

means for controlling an ON/OFF duty ratio of the bias RF power pulse train.

10. A plasma processing apparatus comprising:

a plasma processing chamber;

a first RF antenna arranged at an outer peripheral portion of said plasma processing chamber;

a second RF antenna arranged at the outer peripheral portion of said plasma processing chamber at a predetermined interval from said first RF antenna;

a phase detection circuit for detecting phases of RF powers respectively supplied to said first RF antenna and said second RF antenna;

a plasma generation RF power supply unit for supplying plasma generation RF powers to said first and second RF antennas, said plasma generation RF power supply unit having phase control means for controlling phases of the RF powers to be supplied to said first and second RF antennas;

a lower electrode in said processing chamber to place a substrate thereon; and a bias RF power supply unit for supplying a bias RF power to said lower electrode, said bias RF power supply unit having phase control means for controlling a phase of the bias RF power to be supplied to said lower electrode so as to delay the phase of the bias RF power with respect to the phases of the RF powers respectively supplied to said first RF antenna and said second RF antenna.

11. An apparatus according to claim 10, wherein said phase control means in said plasma generation RF power supply unit controls the plasma generation RF powers to be supplied to said first and second RF antennas to be in phase.

12. An apparatus according to claim 10, wherein said phase control means in said bias RF power supply unit controls the plasma generation RF powers to be supplied to said first and second RF antennas and the bias RF power to be in phase.

13. An apparatus according to claim 10, wherein said plasma generation RF power supply unit forms an RF power of continuous waves as the plasma generation RF powers to be supplied to said first and second RF antennas, and said bias RF power supply unit forms an RF power pulse train as the bias RF power to be supplied to said lower electrode, and said phase control means controls a phase of the RF power pulse train to be supplied to said lower electrode.

14. An apparatus according to claim 13, further comprising:

means for controlling an ON/OFF duty ratio of the RF power pulse train.

15. An apparatus according to claim 10, wherein said plasma generation RF power supply unit forms RF power pulse trains as the plasma generation RF powers to be supplied to said first and second RF antennas, and said phase control means controls phases of respective RF power pulse trains to be supplied to said first and second RF antennas, and said bias RF power supply unit forms an RF power pulse train as the bias RF power to be supplied to said lower electrode, and said phase control means controls a phase of the RF power pulse train to be supplied to said lower electrode.

16. An apparatus according to claim 15, further comprising:

means for controlling an ON/OFF duty ratio of the bias RF power pulse train.

17. An apparatus according to claim 15, wherein said phase control means of said bias RF supply unit controls the bias RF power pulse train to have a predetermined delay from the respective plasma generation RF power pulse trains.

18. An apparatus according to claim 15, wherein said phase control means of said bias RF supply unit controls the bias RF power pulse train to have a predetermined delay from the respective plasma generation RF power pulse trains, and said bias RF supply unit performs control of decreasing a power value of a bias RF power pulse in an after glow period of a pulse plasma.

19. An apparatus according to claim 15, wherein said bias RF power supply unit forms an RF power pulse train having a pulse width of the bias RF power pulse train larger than that of the respective plasma generation RF power pulse trains, and a waveform in which a power value is decreased in an after glow period of a plasma.

* * * * *